(12) United States Patent
Macheiner et al.

(10) Patent No.: US 10,796,986 B2
(45) Date of Patent: Oct. 6, 2020

(54) LEADFRAME LEADS HAVING FULLY PLATED END FACES

(71) Applicant: Infineon Technologies AG, Neubiberg (DE)

(72) Inventors: Stefan Macheiner, Kissing (DE); Markus Dinkel, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 29 days.

(21) Appl. No.: 15/075,266

(22) Filed: Mar. 21, 2016

(65) Prior Publication Data

US 2017/0271246 A1    Sep. 21, 2017

(51) Int. Cl.
*H01L 23/495* (2006.01)
*H01L 21/288* (2006.01)
(Continued)

(52) U.S. Cl.
CPC ...... *H01L 23/49582* (2013.01); *H01L 21/288* (2013.01); *H01L 21/4825* (2013.01); *H01L 21/4828* (2013.01); *H01L 21/4842* (2013.01); *H01L 21/561* (2013.01); *H01L 22/12* (2013.01); *H01L 23/3107* (2013.01); *H01L 23/4951* (2013.01); *H01L 23/49503* (2013.01); *H01L 23/49513* (2013.01); *H01L 23/49548* (2013.01); *H01L 23/49861* (2013.01); *H01L 24/32* (2013.01); *H01L 24/49* (2013.01); *H01L 24/73* (2013.01); *H01L 24/83* (2013.01); *H01L 24/97* (2013.01); *H01L 24/48* (2013.01);
(Continued)

(58) Field of Classification Search
CPC ............. H01L 23/49582; H01L 23/495; H01L 23/49537; H01L 23/498–49805; H01L 23/3107; H01L 23/49541; H01L 23/49548; H01L 23/49861; H01L 21/561; H01L 21/288; H01L 21/4885–4889; H01L 21/4871–4875; H01L 21/4896; H01L 21/4842; H01L 21/4821–4825; H01L 21/4828; H01L 24/97; H01L 24/73
See application file for complete search history.

(56) References Cited

U.S. PATENT DOCUMENTS 5,521,432 A * 5/1996 Tsuji ................. H01L 23/49582
257/677
5,710,064 A * 1/1998 Song ................... H01L 23/4334
438/123
(Continued)

FOREIGN PATENT DOCUMENTS

CN    1571151    1/2005

*Primary Examiner* — Zandra V Smith
*Assistant Examiner* — Jeremy J Joy
(74) *Attorney, Agent, or Firm* — Dicke, Billig & Czaja, PLLC (57) ABSTRACT

A semiconductor device includes a leadframe, a semiconductor die attached to the leadframe, and an encapsulation material encapsulating the semiconductor die and a portion of the leadframe. The leadframe includes a first main face and a second main face opposite to the first main face. The leadframe includes leads wherein each lead includes a fully plated end face extending between an unplated first sidewall and an unplated second sidewall opposite to the first sidewall. The end face and the first and second sidewalls of each lead are perpendicular to the first and second main faces.

19 Claims, 5 Drawing Sheets

(51) Int. Cl.
*H01L 21/48* (2006.01)
*H01L 21/56* (2006.01)
*H01L 21/66* (2006.01)
*H01L 23/31* (2006.01)
*H01L 23/498* (2006.01)
*H01L 23/00* (2006.01)

(52) U.S. Cl.
CPC ........... *H01L 2224/32245* (2013.01); *H01L 2224/48091* (2013.01); *H01L 2224/48106* (2013.01); *H01L 2224/48247* (2013.01); *H01L 2224/48465* (2013.01); *H01L 2224/73265* (2013.01); *H01L 2224/97* (2013.01); *H01L 2924/00014* (2013.01)

(56) References Cited

U.S. PATENT DOCUMENTS

| | | | | |
|---|---|---|---|---|
| 6,194,777 | B1 * | 2/2001 | Abbott | H01L 23/49582 257/666 |
| 6,245,448 | B1 * | 6/2001 | Abbott | H01L 23/49582 257/677 |
| 6,518,508 | B2 * | 2/2003 | Park | H01L 23/49582 174/255 |
| 6,583,500 | B1 * | 6/2003 | Abbott | H01L 23/49582 257/666 |
| 6,608,366 | B1 * | 8/2003 | Fogelson | H01L 21/561 257/666 |
| 6,611,047 | B2 * | 8/2003 | Hu | H01L 21/565 257/666 |
| 6,696,747 | B1 * | 2/2004 | Lee | H01L 23/3107 257/666 |
| 6,828,660 | B2 * | 12/2004 | Abbott | H01L 23/49582 257/666 |
| 6,917,097 | B2 * | 7/2005 | Chow | H01L 23/3107 257/666 |
| 9,324,637 | B1 * | 4/2016 | Bai | H01L 24/97 |
| 2001/0054750 | A1 * | 12/2001 | Abbott | H05K 3/3426 257/666 |
| 2002/0053721 | A1 * | 5/2002 | Kubara | H01L 23/49582 257/666 |
| 2003/0146497 | A1 * | 8/2003 | Abbott | H01L 24/48 257/666 |
| 2005/0233500 | A1 * | 10/2005 | Kim | H01L 23/49548 438/123 |
| 2006/0049493 | A1 * | 3/2006 | Lee | H01L 23/49524 257/666 |
| 2006/0138615 | A1 * | 6/2006 | Sato | H01L 23/49548 257/666 |
| 2007/0102807 | A1 * | 5/2007 | Pohl | H01L 23/49861 257/700 |
| 2007/0126092 | A1 * | 6/2007 | San Antonio | H01L 24/86 257/674 |
| 2008/0173991 | A1 * | 7/2008 | Cruz | H01L 23/49562 257/676 |
| 2009/0065915 | A1 * | 3/2009 | Lehmann | H01L 24/83 257/676 |
| 2010/0078803 | A1 | 4/2010 | Andou et al. | |
| 2010/0109135 | A1 * | 5/2010 | Jereza | H01L 23/49562 257/676 |
| 2010/0164078 | A1 * | 7/2010 | Madrid | H01L 23/49562 257/675 |
| 2010/0187663 | A1 * | 7/2010 | Celaya | H01L 23/49582 257/666 |
| 2011/0108965 | A1 * | 5/2011 | Hess | H01L 23/49548 257/676 |
| 2014/0001616 | A1 * | 1/2014 | Daniels | H01L 23/49541 257/676 |
| 2015/0380384 | A1 * | 12/2015 | Williams | H01L 23/49555 438/112 |
| 2016/0027721 | A1 * | 1/2016 | Lee | H01L 24/97 174/261 |
| 2016/0254214 | A1 * | 9/2016 | Makino | H01L 23/49582 257/676 |

* cited by examiner

LEADFRAME LEADS HAVING FULLY PLATED END FACES

BACKGROUND

A semiconductor device may include a leadframe having leads for electrically coupling the semiconductor device to a circuit board. The leads of the semiconductor device may be soldered to the circuit board. Automated optical inspection (AOI) may be used to inspect solder wetting between the leads of the semiconductor device and the circuit board. Some semiconductor devices, however, which have a leadless package (e.g., quad-flat no-lead (QFN) or dual-flat no-lead (DFN)) or a short lead package, may be unsuitable for AOI.

For these and other reasons, there is a need for the present invention.

SUMMARY

One example of a semiconductor device includes a leadframe, a semiconductor die attached to the leadframe, and an encapsulation material encapsulating the semiconductor die and a portion of the leadframe. The leadframe includes a first main face and a second main face opposite to the first main face. The leadframe includes leads wherein each lead includes a fully plated end face extending between an unplated first sidewall and an unplated second sidewall opposite to the first sidewall. The end face and the first and second sidewalls of each lead are perpendicular to the first and second main faces.

DETAILED DESCRIPTION

In the following Detailed Description, reference is made to the accompanying drawings, which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various examples described herein may be combined with each other, unless specifically noted otherwise.

As used herein, the term "electrically coupled" is not meant to mean that the elements must be directly coupled together and intervening elements may be provided between the "electrically coupled" elements.

For automated optical inspection (AOI) to determine whether solder wetting between a lead of a semiconductor device and a circuit board is acceptable, the solder should form a solder fillet extending up the end face of the lead. Semiconductor devices having a leadless package or a short lead package may not enable AOI since the end face of each lead of the package may not allow solder wetting. Accordingly, semiconductor devices as described herein include leads having a fully plated end face that enables solder wetting to provide a solder fillet. In this way, AOI may be used to inspect solder wetting between the semiconductor devices and a circuit board.

Figure 1A:
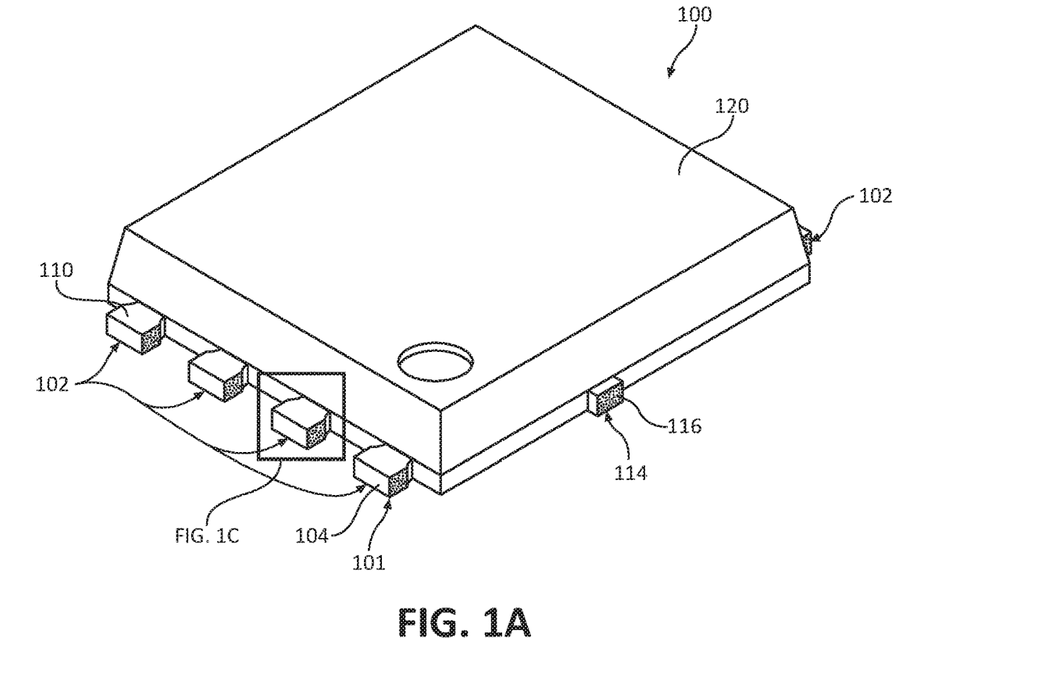
FIGS. 1A-1C illustrate various views of one example of a semiconductor device including leads having fully plated end faces.
Figure 1B:
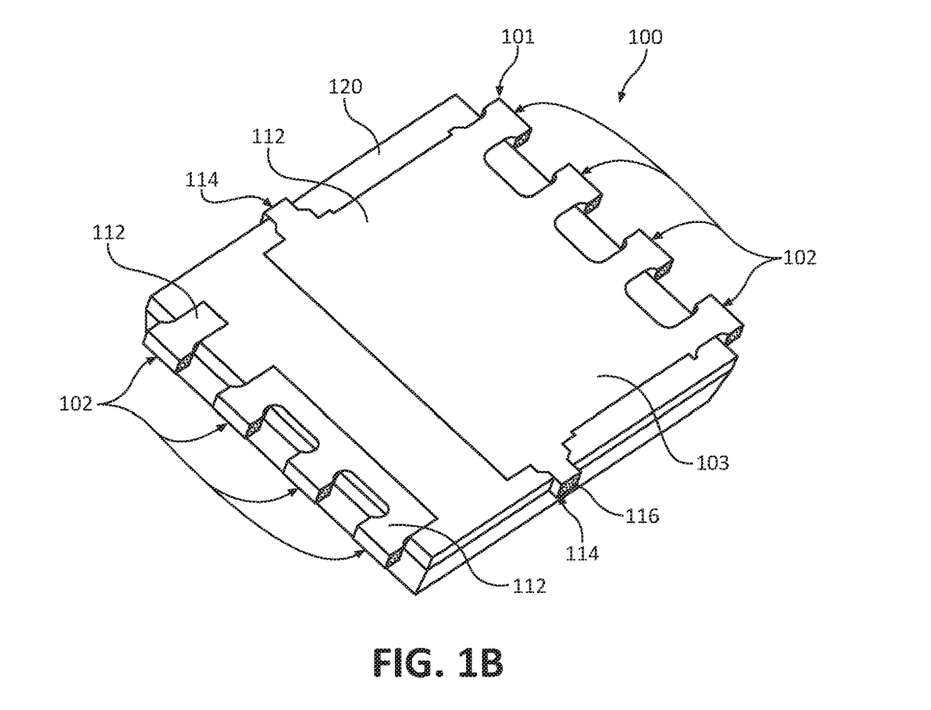
Figure 1C:
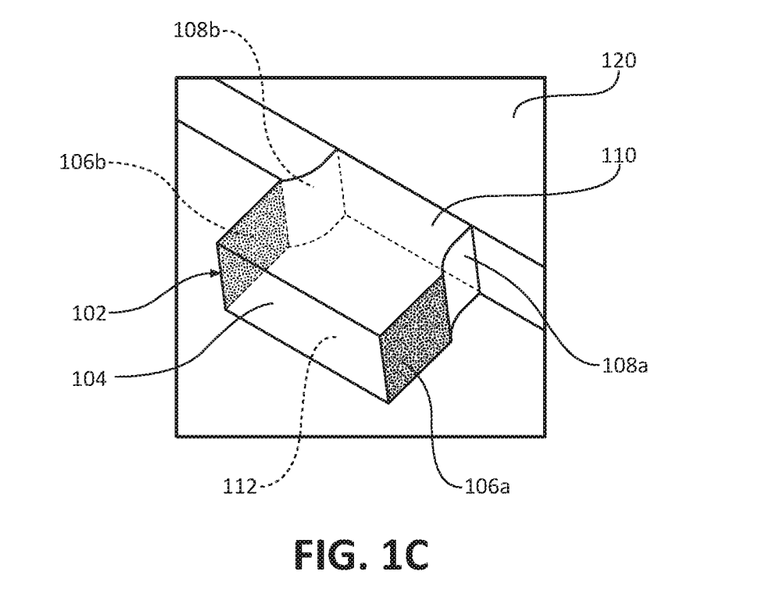

FIG. 1A illustrates a top perspective view and FIG. 1B illustrates a bottom perspective view of one example of a semiconductor device 100 including leads having fully plated end faces. FIG. 1C illustrates an enlarged view of one example of a lead of semiconductor device 100 including a fully plated end face. Semiconductor device 100 includes a semiconductor die (not visible) attached to a leadframe 101. The semiconductor die and portions of leadframe 101 are encapsulated by an encapsulation material 120 (e.g., mold material).

Leadframe 101 includes a first main face 110 (i.e., top surface) and a second main face 112 (i.e., bottom surface) opposite to the first main face 110. Leadframe 101 may include copper, a copper alloy, a nickel-iron alloy, or another suitable metal. Leadframe 101 is plated with a material layer (e.g., tin, solder, solder alloy) to improve the solderability of leadframe 101 to a circuit board. Leadframe 101 includes a die pad 103, a plurality of leads 102, and tiebars 114.

Each tiebar 114 connects die pad 103 of leadframe 101 to a frame of a leadframe strip prior to singulation to separate leadframe 101 from the leadframe strip. Each tiebar 114 includes an end face 116 extending between first main face 110 and second main face 112 of leadframe 101. Each end face 116 is unplated since each end face 116 is formed when leadframe 101 is singulated from a leadframe strip. Accordingly, each end face 116 exposes the metal of leadframe 101. The sidewalls of each tiebar 114 extending between end face 116 and encapsulation material 120 are plated since the sidewalls are not severed during singulation of leadframe 101 from a leadframe strip.

As illustrated in FIG. 1C, each lead 102 includes first main face 110 and second main face 112 of leadframe 101. In addition, each lead 102 includes a fully plated end face 104, first and second unplated sidewalls 106a and 106b, and first and second plated sidewalls 108a and 108b, respectively. First unplated sidewall 106a is opposite to second unplated sidewall 106b. Each unplated sidewall 106a and 106b extends between first main face 110 and second main face 112. In one example, first and second unplated sidewalls 106a and 106b are planar and perpendicular to end face 104. First and second sidewalls 106a and 106b are formed when leadframe 101 is singulated from a leadframe strip. Accordingly, first and second sidewalls 106a and 106b expose the metal of leadframe 101. In other examples, first and second unplated sidewalls 106a and 106b may have another suitable shape.

First plated sidewall 108a is opposite to second plated sidewall 108b. Each plated sidewall 108a and 108b extends between first main face 110 and second main face 112. In one example, first and second plated sidewalls 108a and 108b are concave and extend between first and second unplated sidewalls 106a and 106b and encapsulation material 120, respectively. First and second sidewalls 108a and 108b are plated since they are not severed during singulation of leadframe 101 from a leadframe strip. In other examples, first and second plated sidewalls 108a and 108b have another suitable shape.

Fully plated end face 104 extends between first main face 110 and second main face 112 and between first unplated sidewall 106a and second unplated sidewall 106b. End face 104 is plated since end face 104 is not severed during singulation of leadframe 101 from a leadframe strip. Fully plated end face 104 enables AOI of solder wetting between lead 102 and a circuit board since the plating enables solder wetting of end face 104. In this way, a solder fillet suitable for AOI is formed on end face 104 when lead 102 is soldered to a circuit board.

Figure 2:
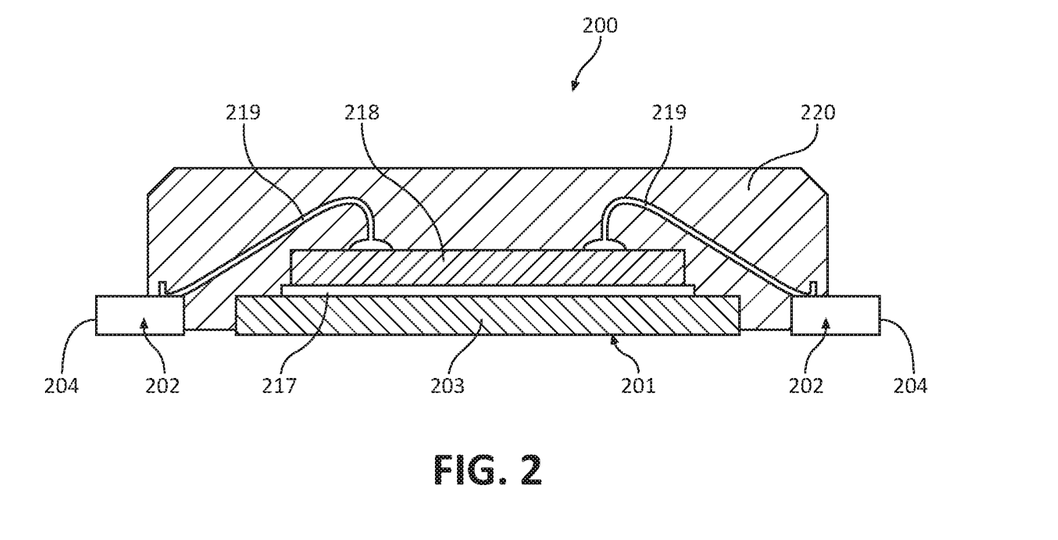
FIG. 2 illustrates a cross-sectional view of one example of a semiconductor device including leads having fully plated end faces.

FIG. 2 illustrates a cross-sectional view of one example of a semiconductor device 200 including leads having fully plated end faces. Semiconductor device 200 includes a leadframe 201, a semiconductor die 218, bond wires 219, and encapsulation material 220. Leadframe 201 includes a die pad 203 and leads 202. Semiconductor die 218 is coupled to die pad 203 of leadframe 201. In one example, semiconductor die 218 is electrically and/or thermally coupled to die pad 203 via an electrically conductive and/or thermally conductive material layer 217 (e.g., solder). In another example, semiconductor die 218 is electrically isolated from die pad 203 by a dielectric material layer 217 (e.g., a non-conductive adhesive). Contacts on the upper surface of semiconductor die 218 are electrically coupled to corresponding leads 202 via bond wires 219. In other examples, bond wires 219 may be replaced with other suitable interconnects, such as ribbons and/or clips. Bond wires 219, semiconductor die 218, material layer 217, and portions of leadframe 201 are encapsulated by encapsulation material 220.

Each lead 202 includes a fully plated end face 204. In one example, each lead 202 is similar to lead 102 previously described and illustrated with reference to FIG. 1C. Fully plated end face 204 of each lead 202 enables AOI of solder wetting between each lead 202 and a circuit board when semiconductor device 200 is soldered to a circuit board.

Figure 3:
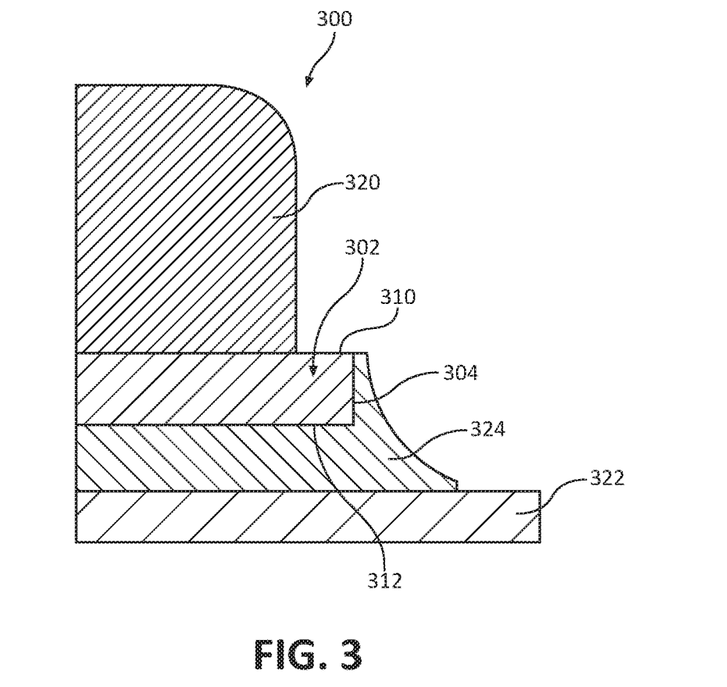
FIG. 3 illustrates a cross-sectional view of one example of a portion of a semiconductor device electrically coupled to a circuit board.

FIG. 3 illustrates a cross-sectional view of one example of a portion of a semiconductor device 300 electrically coupled to a circuit board 322. Semiconductor device 300 includes a lead 302 including a first main face 310, a second main face 312 opposite to first main face 310, and a fully plated end face 304 extending between first main face 310 and second main face 312. An encapsulation material 320 partially encapsulates lead 302. Lead 302 is electrically coupled to circuit board 322 via solder 324. Due to the fully plated end face 304 of lead 302, end face 304 is wettable by solder such that a fillet of solder is formed on end face 304 when lead 302 is soldered to circuit board 322. The fillet of solder formed on end face 304 enables AOI of solder wetting between lead 302 and circuit board 322.

Figure 4:
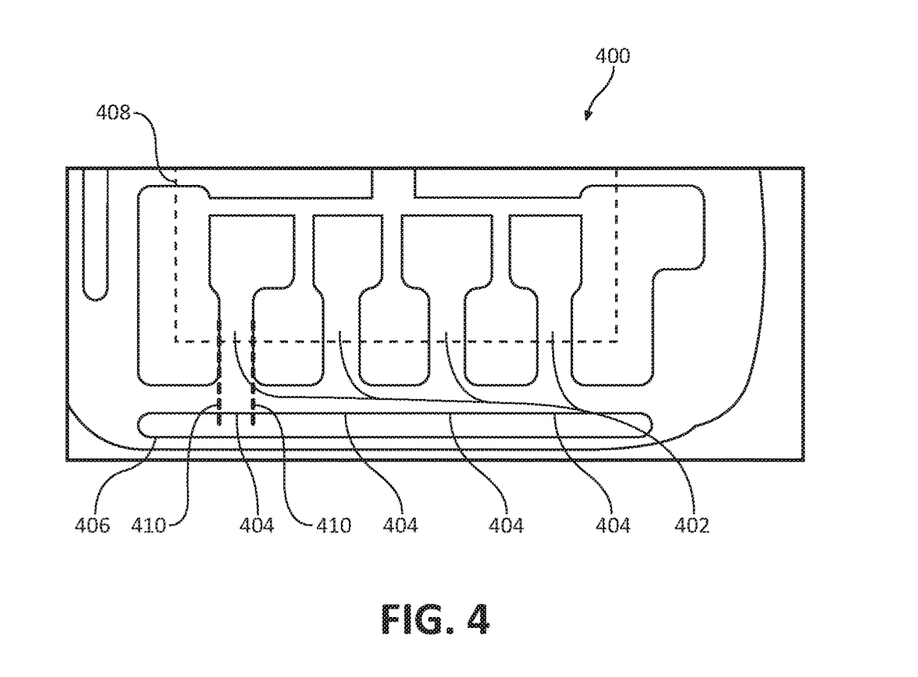
FIG. 4 illustrates a top view of one example of a portion of a leadframe prior to singulation including leads having fully plated end faces.

FIG. 4 illustrates a top view of one example of a portion of a leadframe 400 prior to singulation including leads having fully plated end faces. An outline of encapsulation material that may encapsulate a semiconductor die and a portion of leadframe 400 is indicated at 408 by dashed lines. The surfaces of leadframe 400 are plated such that leadframe 400 includes leads 402 having fully plated end faces 404. Fully plated end faces 404 are provided by opening 406 through leadframe 400. To singulate leadframe 400 from other leadframes of a leadframe strip, each lead 402 is severed as indicated by dashed lines 410 to provide unplated sidewalls of each lead 402. In this way, the end faces 404 of each lead 402 are not severed and therefore remain fully plated after singulation of leadframe 400 from a leadframe strip.

Figure 5:
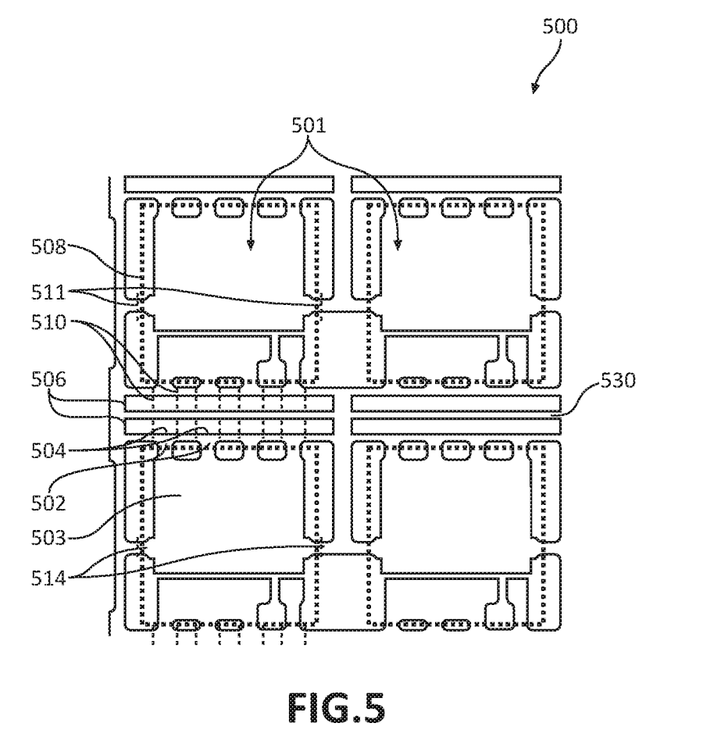
FIG. 5 illustrates a top view of one example of a leadframe strip including a plurality of leadframes.

FIG. 5 illustrates a top view of one example of a leadframe strip 500 including a plurality of leadframes 501 connected to each other via a frame 530. An outline of encapsulation material that may encapsulate a semiconductor die and a portion of each leadframe 501 is indicated at 508 by dashed lines. Leadframe strip 500 may include any suitable number of leadframes 501 arranged in rows and columns. Each leadframe 501 includes a die pad 503, leads 502, and tiebars 514. Die pads 503, leads 502, and tiebars 514 are connected to each other via frame 530. Each lead 502 has a fully plated end face 504. Fully plated end faces 504 are provided by openings 506 through leadframe strip 500. Leadframe strip 500 may be formed by cutting, stamping, punching, or etching sheet material to provide openings, including openings 506, defining frame 530 and each leadframe 501.

Once frame 530 and each leadframe 501 is formed, leadframe strip 500 is plated with a material (e.g., tin, solder, solder alloy) to improve the solderability of each leadframe 501 to a circuit board. In one example, leadframe strip 500 is plated (e.g., via an electroplating process) prior to attaching the semiconductor dies to each leadframe 501 and encapsulating each semiconductor die. In another example, leadframe strip 500 is plated (e.g., via an electroless plating process) after attaching the semiconductor dies to each leadframe 501 and encapsulating each semiconductor die.

To singulate each leadframe 501 from leadframe strip 500, each lead 502 is severed as indicated by dashed lines 510 to provide unplated sidewalls of each lead 502. In this way, the end faces 504 of each lead are not severed and therefore remain fully plated after singulation of each leadframe 501 from leadframe strip 500. In addition, to singulate each leadframe 501 from leadframe strip 500, each tiebar 514 is severed as indicated by dashed lines 511 to provide unplated end faces of each tiebar 514. Each leadframe 501 may be singulated from leadframe strip 500 by cutting, stamping, punching, etching, or other suitable process. In one example, leadframe strip 500 is singulated to provide a plurality of leadframes, such as leadframe 600 illustrated in the following FIG. 6.

Figure 6:
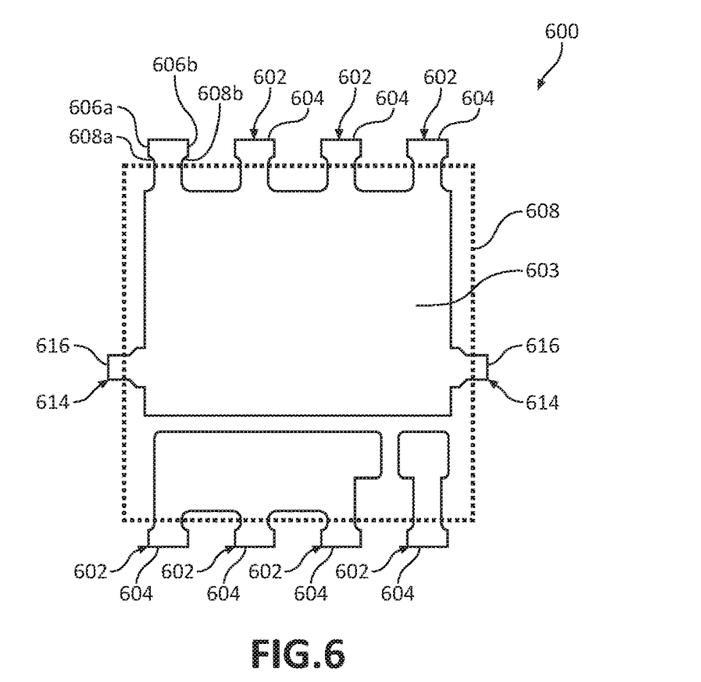
FIG. 6 illustrates a top view of one example of a leadframe after singulation of the leadframe from the leadframe strip illustrated in FIG. 5.

FIG. 6 illustrates a top view of one example of a leadframe 600 after singulation from a leadframe strip, such as leadframe strip 500 previously described and illustrated with reference to FIG. 5. An outline of encapsulation material that may encapsulate a semiconductor die and a portion of leadframe 600 is indicated at 608 by dashed lines. Leadframe 600 includes leads 602, a die pad 603, and tiebars 614. Each lead 602 has a fully plated end face 604, first and second unplated sidewalls 606a and 606b, and first and second plated sidewalls 608a and 608b.

Each tiebar 614 includes an unplated end face 616. Each end face 616 is unplated since each end face 616 is formed when leadframe 600 is singulated from a leadframe strip. Accordingly, each end face 616 exposes the metal of leadframe 600. The sidewalls of each tiebar 614 extending between end face 616 and encapsulation material 608 are plated since the sidewalls are not severed during singulation of leadframe 600 from a leadframe strip.

First unplated sidewall 606a of each lead 602 is opposite to second unplated sidewall 606b of each lead 602. In one example, first and second unplated sidewalls 606a and 606b are planar and perpendicular to end face 604. First and second sidewalls 606a and 606b are formed when leadframe 600 is singulated from a leadframe strip. Accordingly, first and second sidewalls 606a and 606b expose the metal of leadframe 600. In other examples, first and second unplated sidewalls 606a and 606b may have another suitable shape.

First plated sidewall 608a of each lead 602 is opposite to second plated sidewall 608b of each lead 602. In one example, first and second plated sidewalls 608a and 608b are concave and extend between first and second unplated sidewalls 606a and 606b and encapsulation material 608, respectively. First and second sidewalls 608a and 608b are plated since they are not severed during singulation of leadframe 600 from a leadframe strip.

Fully plated end face 604 of each lead 602 extends between first unplated sidewall 606a and second unplated sidewall 606b. End face 604 is plated since end face 604 is not severed during singulation of leadframe 600 from a leadframe strip. Fully plated end face 604 enables AOI of solder wetting between each lead 602 and a circuit board since the plating enables solder wetting of end face 604. In this way, a solder fillet suitable for AOI is formed on end face 604 when each lead 602 is soldered to a circuit board.

Figure 7:
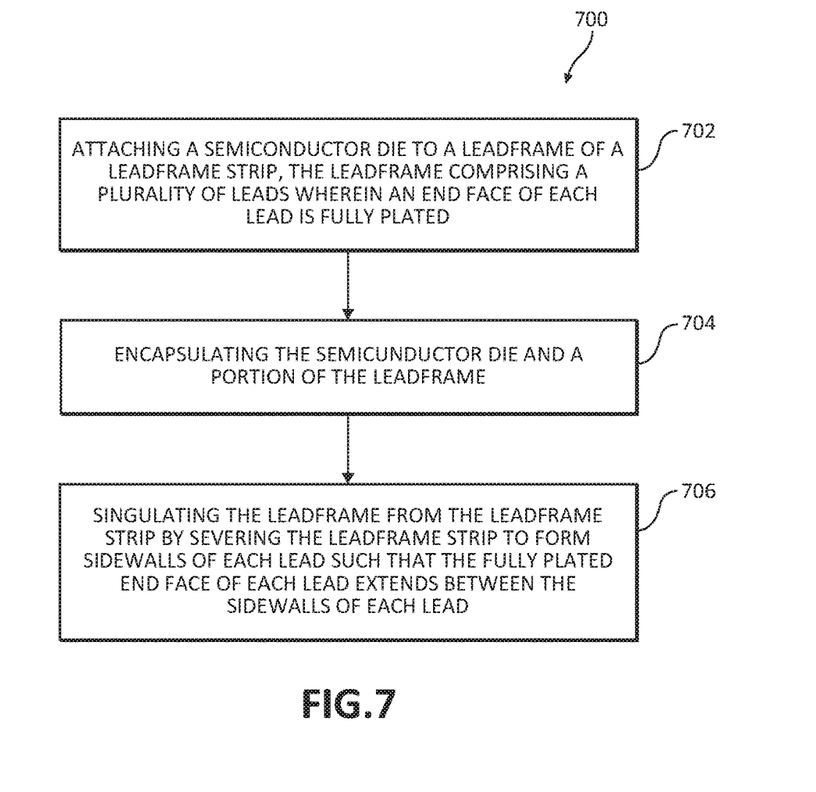
FIG. 7 is a flow diagram illustrating one example of a method for fabricating a semiconductor device including leads having fully plated end faces.

FIG. 7 is a flow diagram illustrating one example of a method 700 for fabricating a semiconductor device including leads having fully plated end faces. At 702, method 700 includes attaching a semiconductor die to a leadframe of a leadframe strip, the leadframe comprising a plurality of leads wherein an end face of each lead is fully plated. At 704, method 700 includes encapsulating the semiconductor die and a portion of the leadframe. At 706, method 700 includes singulating the leadframe from the leadframe strip by severing the leadframe strip to form sidewalls of each lead such that the fully plated end face of each lead extends between the sidewalls of each lead. The leadframe may be singulated from the leadframe strip by cutting, stamping, punching, etching, or other suitable process.

In one example, method 700 further includes forming the leadframe strip via stamping or etching. Method 700 may also include plating (e.g., via an electroplating process) the leadframe strip prior to attaching the semiconductor die. In another example, the leadframe strip may be plated (e.g., via an electroless plating process) after attaching the semiconductor die. Attaching the semiconductor die to the leadframe may include electrically coupling the semiconductor die to a die pad of the leadframe. Method 700 may also include soldering each lead of the leadframe to a circuit board and inspecting solder wetting between each lead of the leadframe and the circuit board via an automated optical inspection process.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
   a leadframe comprising a first main face disposed entirely in a first plane and a second main face opposite to the first main face disposed entirely in a second plane, the leadframe comprising leads wherein each lead comprises a fully plated planar end face extending between an unplated first sidewall on a first side of the lead and an unplated second sidewall on a second side of the lead that is opposite to the unplated first sidewall, wherein the fully plated planar end face and the unplated first sidewall and the unplated second sidewall of each lead are perpendicular to the first and second main faces;
   a semiconductor die attached to the leadframe; and
   an encapsulation material encapsulating the semiconductor die and a portion of the leadframe and forming a plurality of side surfaces of the semiconductor device at an outline of the encapsulation material,
   wherein each lead includes a bottom fully plated second main face interior to the outline and below the encapsulation material to improve the solderability of the fully plated second main face to a circuit board, wherein each lead extends from a side surface of the plurality of side surfaces and includes a plated first sidewall on the first side of the lead that is between the unplated first sidewall and the encapsulation material and a plated second sidewall on the second side of the lead that is between the unplated second sidewall and the encapsulation material, wherein each lead, on the first side of the lead, includes only the unplated first sidewall and the plated first sidewall, wherein each lead, on the second side of the lead, includes only the unplated second sidewall and the plated second sidewall, and
   where the plated first sidewall is nonplanar with the unplated first sidewall, and where the plated second sidewall is nonplanar with the unplated second sidewall.

2. The semiconductor device of claim 1, wherein the fully plated end face of each lead is plated with a material layer to improve the solderability of an end face of each lead.

3. The semiconductor device of claim 1, wherein the leadframe comprises a metal, and
   wherein the unplated first sidewall and the unplated second sidewall of each lead exposes the metal.

4. The semiconductor device of claim 1, wherein the fully plated end face of each lead enables automated optical inspection of solder wetting between the leadframe and a circuit board.

5. The semiconductor device of claim 1, wherein the portion of the leadframe to which the semiconductor die is attached is a die pad.

6. The semiconductor device of claim 5, wherein the semiconductor die is electrically coupled to the die pad.

7. The semiconductor device of claim 1, wherein the unplated first sidewall is planar and wherein the unplated second sidewall is planar and parallel to the unplated first sidewall.

8. The semiconductor device of claim 1, wherein the plurality of side surfaces include first and second opposing side surfaces, and third and fourth opposing side surfaces, the third and fourth opposing side surfaces are perpendicular to the first and second opposing side surfaces, wherein leads extend from the first and second side surfaces and a tie bar extends from each of the third and fourth side surfaces.

9. The semiconductor device of claim 8, wherein leads extending from the first side surface comprise a drain electrode and leads extending from the opposing second side surface comprises a source electrode and a gate electrode of the semiconductor die.

10. The semiconductor device of claim 1, where the first plated sidewall and the second plated sidewall are curved.

11. The semiconductor device of claim 10, where the first plated sidewall and the second plated sidewall are concave.

12. The semiconductor device of claim 1, where the leads extend from at least one of the plurality of side surfaces.

13. The semiconductor device of claim 1, comprising:
a tie bar extending from a side surface of the semiconductor device, the tie bar including an unplated tie bar end face and plated tie bar sidewalls.

14. A semiconductor device comprising:
a leadframe including a leadframe body and a plurality of leads extending from the leadframe body, each lead including a fully plated end face and a first sidewall on a first side of the lead and a second sidewall on a second side of the lead, the first sidewall and the second sidewall each extending between the fully plated end face and the leadframe body, the first sidewall including an unplated first sidewall and a plated first sidewall, where the plated first sidewall is nonplanar relative to the first unplated sidewall; and
an encapsulation material encapsulating at least a portion of the leadframe and forming a plurality of side surfaces of the semiconductor device at an outline of the encapsulation material, where the plurality of leads extend outward from the encapsulation material, wherein each lead includes a bottom fully plated second main face interior to the outline and below the encapsulation material to improve the solderability of the fully plated second main face to a circuit board, and wherein each lead, on the first side of the lead, includes only the unplated first sidewall and the plated first sidewall between the fully plated end face and the encapsulation material.

15. The semiconductor device of claim 14, comprising:
a semiconductor die coupled to the lead frame.

16. The semiconductor device of claim 14 where the plated first sidewall is curved.

17. The semiconductor device of claim 16, where the plated first sidewall is concave.

18. The semiconductor device of claim 14, comprising:
where the second sidewall includes an unplated second sidewall and a plated second sidewall, where the plated second sidewall is nonplanar relative to the unplated second sidewall, wherein each lead, on the second side of the lead, includes only the unplated second sidewall and the plated second sidewall between the fully plated end face and the encapsulation material.

19. The semiconductor device of claim 14, comprising:
a tie bar extending from the lead frame body, the tie bar including an unplated tie bar end face and plated tie bar sidewalls.

* * * * *